US008604818B2

(12) United States Patent
Schmegner et al.

(10) Patent No.: US 8,604,818 B2
(45) Date of Patent: Dec. 10, 2013

(54) APPARATUS FOR CONTACTING A T/R MODULE WITH A TEST DEVICE

(75) Inventors: Karl-Ernst Schmegner, Nersingen (DE); Thomas Johannes Mueller, Erbach (DE); Georg Hoefer, Lonsee (DE)

(73) Assignee: EADS Deutschland GmbH, Ottobrunn (DE)

(*) Notice: Subject to any disclaimer, the term of this patent is extended or adjusted under 35 U.S.C. 154(b) by 392 days.

(21) Appl. No.: 12/991,657

(22) PCT Filed: Apr. 2, 2009

(86) PCT No.: PCT/DE2009/000459
§ 371 (c)(1),
(2), (4) Date: Jan. 19, 2011

(87) PCT Pub. No.: WO2009/135452
PCT Pub. Date: Nov. 12, 2009

(65) Prior Publication Data
US 2011/0109341 A1     May 12, 2011

(30) Foreign Application Priority Data
May 9, 2008  (DE) .................. 10 2008 023 130

(51) Int. Cl.
*G01R 31/00*     (2006.01)
(52) U.S. Cl.
USPC ................................................. 324/756.05
(58) Field of Classification Search
USPC ................................................. 324/756.05
See application file for complete search history.

(56) References Cited

U.S. PATENT DOCUMENTS

| 4,576,057 A * | 3/1986 | Saari ........................... 74/424.92 |
| 4,707,656 A | 11/1987 | Marzan |
| 4,947,111 A | 8/1990 | Higman et al. |
| 5,086,268 A | 2/1992 | Zimmermann |
| 5,151,652 A | 9/1992 | Moschuering |

(Continued)

FOREIGN PATENT DOCUMENTS

| DE | 41 07 248 A1 | 9/1992 |
| EP | 0 388 485 A1 | 9/1990 |
| EP | 0 419 725 A1 | 4/1991 |

OTHER PUBLICATIONS

Section 1 Frequency and Wavelength Bands, Nomenclature, Article 2, Radio Regulations, ITU, 2008.*

*Primary Examiner* — Patrick Assouad
*Assistant Examiner* — Stephen G Armstrong
(74) *Attorney, Agent, or Firm* — Crowell & Moring LLP

(57) ABSTRACT

An apparatus for making contact between a T/R module and a test device, the apparatus including a mechanically guided contact-making unit having a plurality of contact elements for contacting the T/R module. A triplate line substrate is arranged is electrically connected to the T/R module, via which the RF signals can be passed to the test device. One or more register pins for defined alignment of the T/R module with respect to the contact-making unit and a fixing unit for mechanical fixing of the T/R module are provided. A shifting device has a plurality of inclined planes that convert a shifting movement of the shifting device to a movement of the contact-making unit toward the T/R module at right angles to the shifting direction. When the contact-making unit reaches a defined final position the contact is made with the T/R module via the contact elements in one process.

16 Claims, 9 Drawing Sheets

(56) References Cited

U.S. PATENT DOCUMENTS

| | | | |
|---|---|---|---|
| 5,351,001 A * | 9/1994 | Kornrumpf et al. | 324/756.05 |
| 5,462,838 A * | 10/1995 | Sato et al. | 430/313 |
| 5,853,295 A * | 12/1998 | Rosenberger | 439/63 |
| 6,252,414 B1 * | 6/2001 | Boyette et al. | 324/750.22 |
| 6,353,189 B1 * | 3/2002 | Shimada et al. | 174/255 |
| 6,911,835 B2 * | 6/2005 | Chraft et al. | 324/750.27 |
| 7,982,484 B2 * | 7/2011 | Schmegner et al. | 324/762.01 |
| 2004/0257178 A1 * | 12/2004 | Shimoda | 333/238 |
| 2007/0004238 A1 | 1/2007 | Breinlinger et al. | |
| 2008/0030214 A1 * | 2/2008 | Nguyen et al. | 324/758 |

* cited by examiner

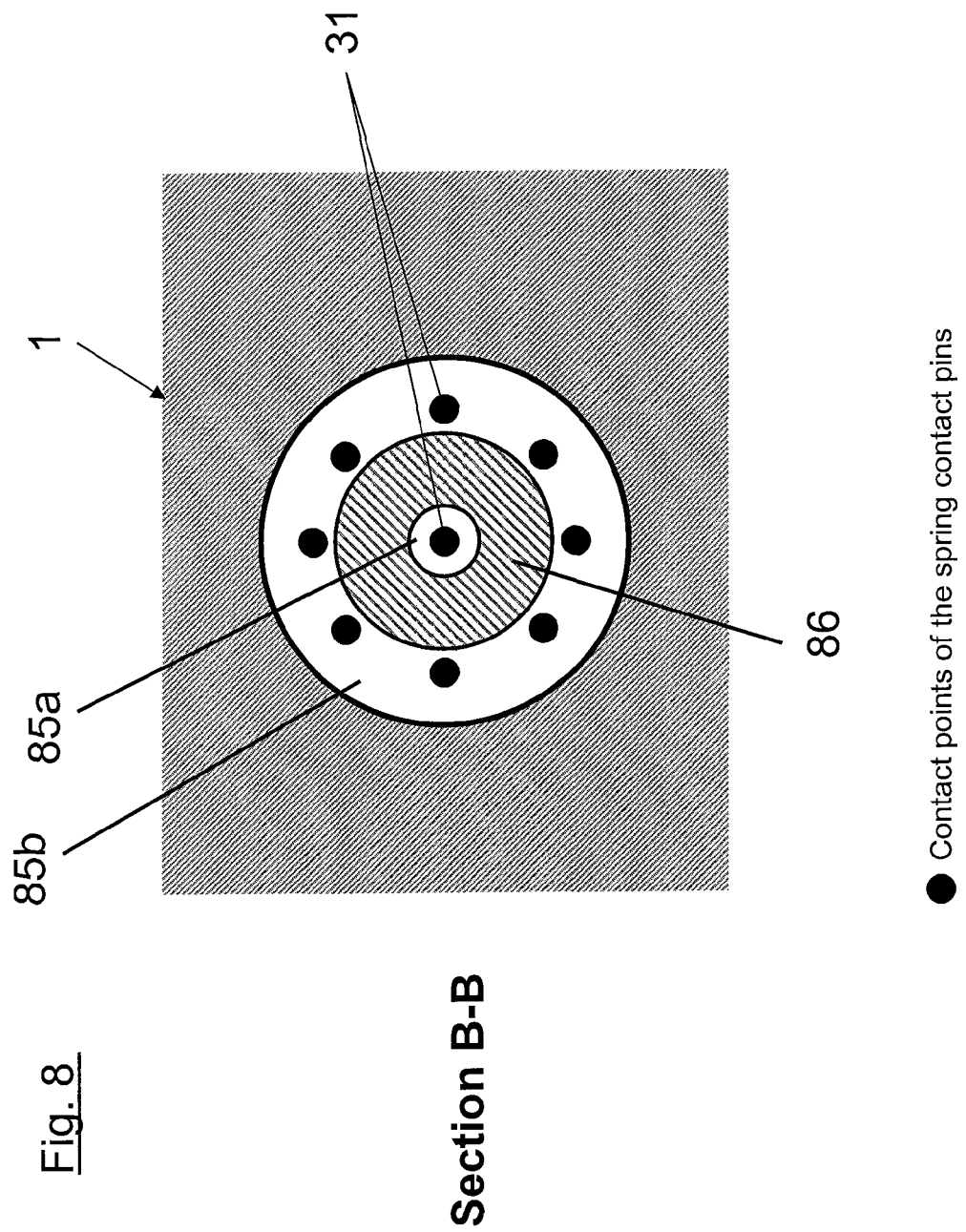

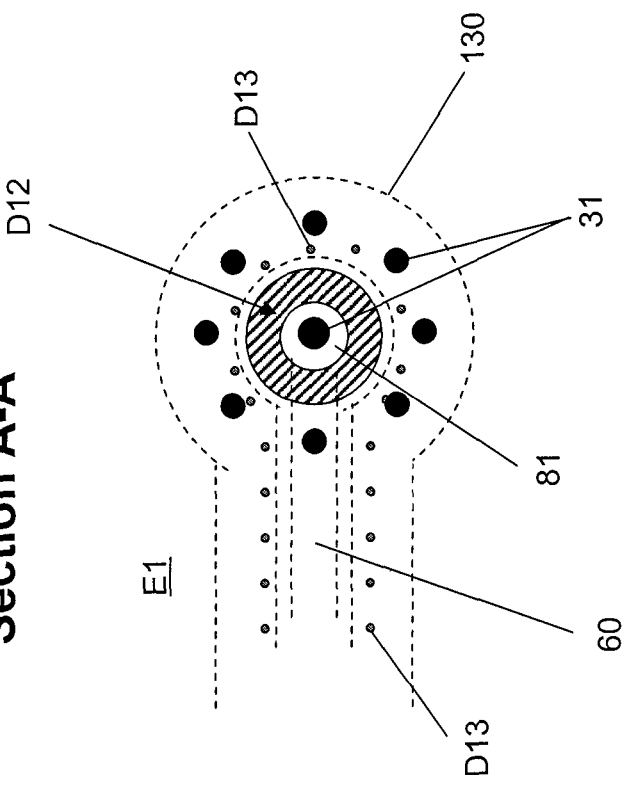

APPARATUS FOR CONTACTING A T/R MODULE WITH A TEST DEVICE

CROSS-REFERENCE TO RELATED APPLICATIONS

This application is a national stage of PCT International Application No. PCT/DE2009/000459, filed Apr. 2, 2009, and claims priority under 35 U.S.C. §119 to German Patent Application No. 10 2008 023 130.4, filed May 9, 2008, the entire disclosure of these patent documents are herein expressly incorporated by reference.

BACKGROUND AND SUMMARY OF THE INVENTION

The invention relates to an apparatus for making contact between a T/R module and a test device. In this case, T/R module is short for transmit-receive modules, such as those used in particular in active antennas in the RF range.

According to the prior art, contact can be made with T/R modules (unit under test) by fitting them in special measurement holders. In these holders, the RF connection to the test environment is made by coaxial plugs and the RF connection to the unit under test is made by adaptors with bonded wires and/or ribbons. The DC supply and the connection for the control signals are provided in a similar manner. Although the bonded connections are removed after a test has been carried out, residues of the connection and visible traces remain on the connecting pads of the units under test.

Instead of using this mechanically complex process of making contact with units under test, which leaves traces and residue can, the testing can be carried out with the aid of needle adaptors for low-frequency operations and the DC supply. For this purpose, the radio-frequency signals are supplied with special coaxial test probes (RF probes). Even when contact is made in this way, both the needles and the test probes leave traces (scratches) on the connecting pads when contact is made, which can adversely affect the further processing of the modules (installation in the system by bonded connection). Furthermore, the connecting pads are kept very small, for space reasons and because of the RF technical requirements. In order to ensure reliable contact with the modules for the measurement, both the unit under test and the test probes must therefore be manually visually aligned with one another, independently of one another, with the assistance of a microscope. This quite complex procedure is the only way to ensure that the individual mechanical tolerances of the units under test do not have a disturbing effect on the electrical characteristics of the modules. It should also be noted that the quality of the contact that is made directly affects the quality of the measurement results, and that high-quality contacts can be achieved only by experienced operating personnel.

When contact is made in this way, the individual test probes must be aligned individually, typically using optical methods with a microscope, and this is very time-consuming. Furthermore, the quality of the contact made is highly dependent on the capabilities of the operating personnel.

German patent document DE 41 07 248 A1 describes a measurement apparatus for a planar circuit, in which the planar circuit is moved with respect to the contact elements of a contact-making unit using a shifting device which has a plurality of inclined planes.

Exemplary embodiment of the present invention provide an apparatus for making contact with T/R modules, which overcomes the disadvantages of the contact-making methods described above, in particular with the aim of achieving a high-quality contact, which can be handled easily and can be reproduced well.

An exemplary apparatus for making contact between a transmit-receive (T/R) module and a test device for transmission of RF signals, includes a mechanically guided contact-making unit in the form of a frame and having a plurality of contact elements for making contact with the T/R module. A line substrate is arranged rigidly on a side of the contact-making unit facing away from the T/R module. The line substrate is electrically connected to the T/R module, the line substrate is a triplate line, and the RF signals are passed to the test device via the line substrate. One or more register pins for defined alignment of the T/R module with respect to the contact-making unit and a fixing unit for mechanical fixing of the T/R module are also provided. A shifting device with a plurality of inclined planes that convert a shifting movement of the shifting device to a movement of the contact-making unit toward the T/R module at right angles to the shifting direction. When the contact-making unit reaches a defined final position the contact is made with the T/R module via the contact elements in one process.

According to the invention, the optical alignment of the unit under test is replaced by mechanical guidance of a contact-making unit, which makes contact with the T/R module to be tested, after reaching a defined final position. The mechanical guidance is provided using a shifting device which has a plurality of inclined planes, wherein the inclined planes convert a shifting movement of the shifting device to a movement of the contact-making unit at right angles to the shifting direction toward the T/R module. The T/R module to be tested is aligned using register pins. A line substrate which is arranged on the contact-making unit makes the connection for the connecting ports of the test device. This line substrate is in the form of a triplate line. The contact-making unit has contact elements (for example spring contact pins) and therefore connects the line substrate to the corresponding contact pads on the T/R module.

When contact is made according to the invention, there is no need to individually align the test probes with the unit under test in order to make a secure and reliable connection with the T/R modules. Likewise, there is no need for viewing through a microscope, as required for this purpose.

All the required contacts, that is to say not only the radio-frequency signals but also the low-frequency signals or DC signals, can be made securely and at the same time in one process.

The apparatus according to the invention means that the quality of the contact made is largely independent of the capabilities of the operating personnel. This ensures that the characteristics of the units under test are reproduced without corruption.

A further advantage is also that the connecting elements (for example spring contact pins) themselves leave neither residues nor visible traces on the contact-making surfaces of the module, even after contact has been made with the same unit under test a number of times. In addition, the spring contact pins can be subjected to a large number of contact-making cycles before any evidence of wear can be found on the contacts.

A further advantage is that the test station can be calibrated very easily, using the same contact-making principle. The calibration elements that are purpose-made for this purpose have the same design as the line substrate and have triplate lines of different length, which are mounted on a metal mount. The metal mount has an external contour which is approximately the same as that of the unit under test, with the same geometry of the connections as the unit under test. The calibration elements can therefore be inserted into the test holder, just as easily, with contact being made in the same way as with the T/R modules. No additional effort is required for adjustment and alignment, for this purpose. Even the sequence of insertion can be preset by the operator, using the control program.

The way in which contact is made according to the invention can be applied without problems to automatic placement and therefore also to automatic testing of relatively large quantities in the course of large-scale manufacture of T/R modules.

Other objects, advantages and novel features of the present invention will become apparent from the following detailed description of one or more preferred embodiments when considered in conjunction with the accompanying drawings.

BRIEF DESCRIPTION OF THE DRAWINGS

The invention will be explained in more detail using exemplary embodiments and with reference to figures, in which:

FIG. 8 shows contact-making elements at the junction between the T/R module and the contact-making unit;

FIG. 9 shows contact-making elements at the junction between the contact-making unit and the line substrate.

DETAILED DESCRIPTION OF THE DRAWINGS

Figure 1:
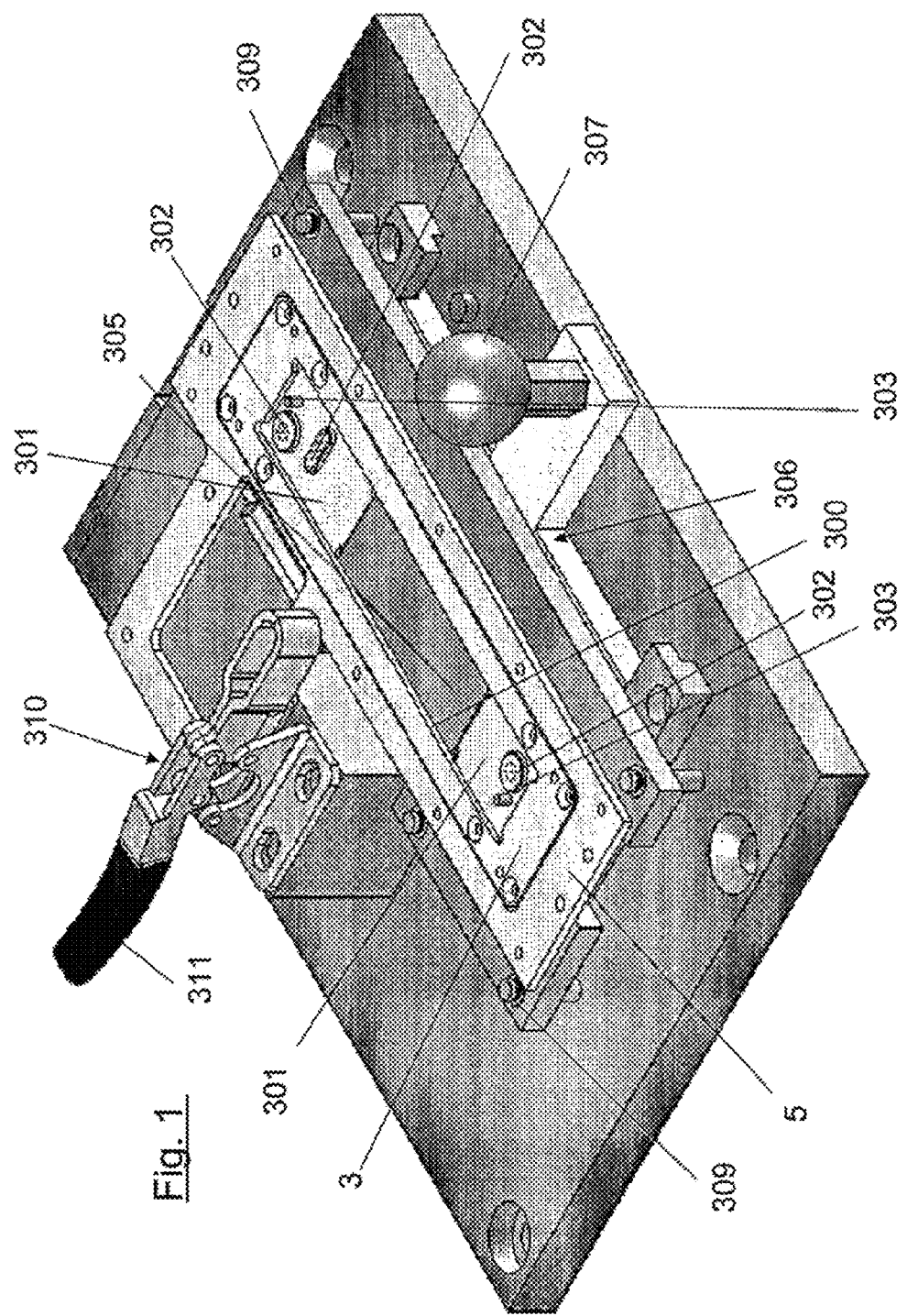
FIG. 1 shows a 3D illustration of an apparatus according to the invention for making contact with mechanical guidance (without a T/R module)

FIG. 1 shows a 3D illustration of an apparatus according to the invention for making contact in the state before a T/R module 1 (FIG. 2) to be measured has been inserted. The apparatus comprises a contact-making unit 3 arranged on a line substrate 5. The line substrate 5 and the contact-making unit 3 are electrically connected to one another via a plurality of contacts, as will be described further below in detail. The contact-making unit has contact elements, such as spring contact pins 32 (FIG. 4), for making contact with the T/R module.

The contact-making unit has a central depression 300 in the form of a trough, in which the T/R module to be measured can be inserted. As illustrated in FIG. 1, the bottom 301 of this depression 300 in the form of a trough has a plurality of raised connecting areas 302 for the electrical contact with the T/R module. A register pin 303 in each case projects to the left and right out of the bottom 301 of the depression 300 in the form of a trough. These register pins 303 are used for unambiguous alignment and centering of the T/R module to be inserted, with respect to the contacts of the contact-making unit 3. The depression 300 in the form of a trough in the contact-making unit 3 does not have a continuous bottom, but has a central rectangular aperture through which the terminating plate of a temperature-control unit 305 projects, with which the T/R module is in thermal contact, as soon as it has been inserted into the apparatus. The temperature-control unit 305 ensures a constant temperature in the test environment.

Figure 3:
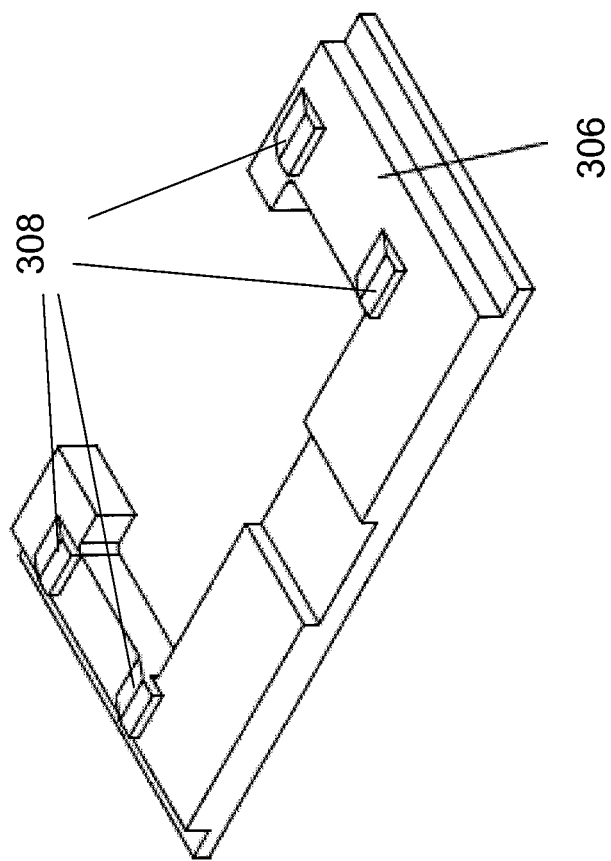
FIG. 3 shows a 3D illustration of the shifting device of the apparatus according to the invention.

In the illustrated state of the apparatus, the temperature-control unit 305 is located on a level somewhat higher than the bottom 301 of the depression 300 in the form of a trough in the contact-making unit 3. When a T/R module is now inserted, it rests on the temperature-control unit 305, but initially does not yet make contact with the contact-making unit 3. Such a contact is made only when a shifting device 306 is shifted, on its shifting lever 307, in the direction of the contact-making unit 3. The shifting device 306, which is shown in detail in FIG. 3 (without the shifting lever) has four inclined planes 308, by means of which the horizontal shifting movement is converted to a vertical linear movement of the contact-making unit 3 with the line substrate 5 arranged on it. Four cylindrical pins 309, which are guided via bushes, guarantee the linear movement of the contact-making unit 3 without tilting. The bottom of the T/R module may be used as a mechanical stop for the upward movement of the contact-making unit 3 and the line substrate 5 which is connected to it. However, it is also possible to provide a stop independently of the T/R module, for example on the side of the temperature-control apparatus (see, for example, FIG. 4). If the stop is on the contact-making unit or the line substrate, the spring contact pins of the contact-making unit make contact at the same time with the complementary contact elements (in this case: contact surfaces) on the T/R module. All the required contacts can therefore be made safely and at the same time in one process.

The register pins 15 are anchored on a mounting plate on the lower face of the line substrate (see FIG. 4) and therefore move together with it. The length of the register pins 303 is chosen such that they project beyond the level of the temperature-control unit 305 even when the contact-making unit 3 is in the lowered position.

The lever 311 is part of a fixing device 310, by means of which the T/R module can be mechanically fixed after insertion by being pushed from above against the temperature-control device 305.

Figure 2:
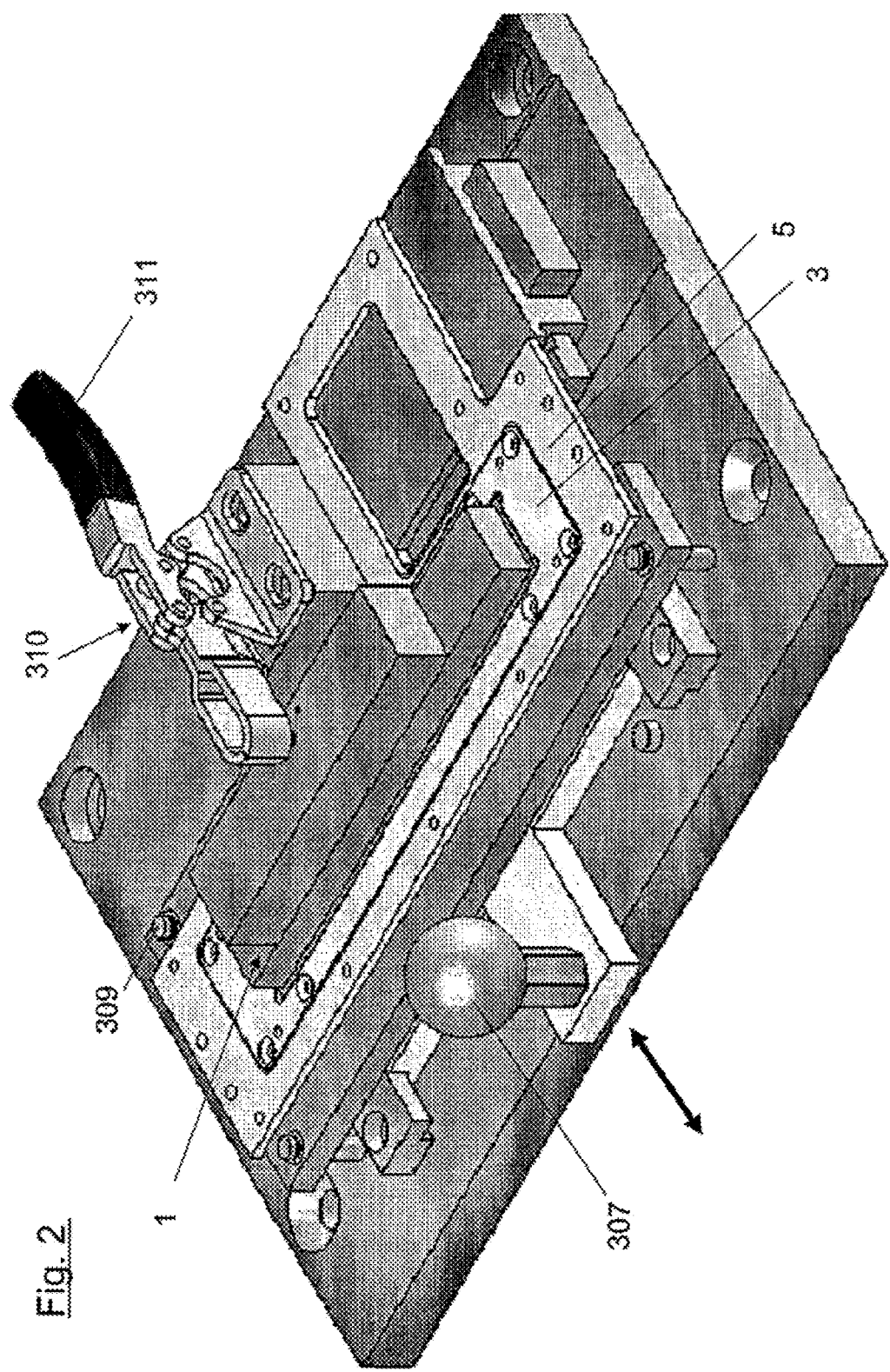
FIG. 2 shows a 3D illustration of an apparatus according to the invention for making contact with mechanical guidance (with an inserted T/R module)

FIG. 2 shows the same apparatus after insertion of the T/R module 1. The apparatus according to the invention is controlled and operated as follows:

the T/R module 1 is placed onto the surface of the temperature-control unit 305 (FIG. 1);

during the insertion process, the T/R module 1 is aligned with the register pins 303;

the fixing unit 310 is lowered from above onto the T/R module 1, and is pressed onto the closed cover of the T/R module 1;

the contact-making unit 3 with the line substrate 5 arranged on it is pressed by horizontal movement on the shifting lever 307 from underneath onto the bottom of the T/R module 1, and the contacts are made at the same time.

After the measurement, the physical unit comprising the contact-making unit 3 and the line substrate 5 is first lowered by pulling the lever 307 back. This opens the contacts again. After the fixing apparatus 310 has been unlocked using the lever 311, the T/R module can be removed. This procedure also applies for calibration, in which calibration standards are measured.

The apparatus according to the invention can be used not only to measure closed modules, but can also be used to subject open modules to an initial test. In order to ensure that the open modules are effectively electrically covered, the cover placed loosely on the module can be pressed from above onto the frame of the module using the fixing apparatus.

Figure 4:
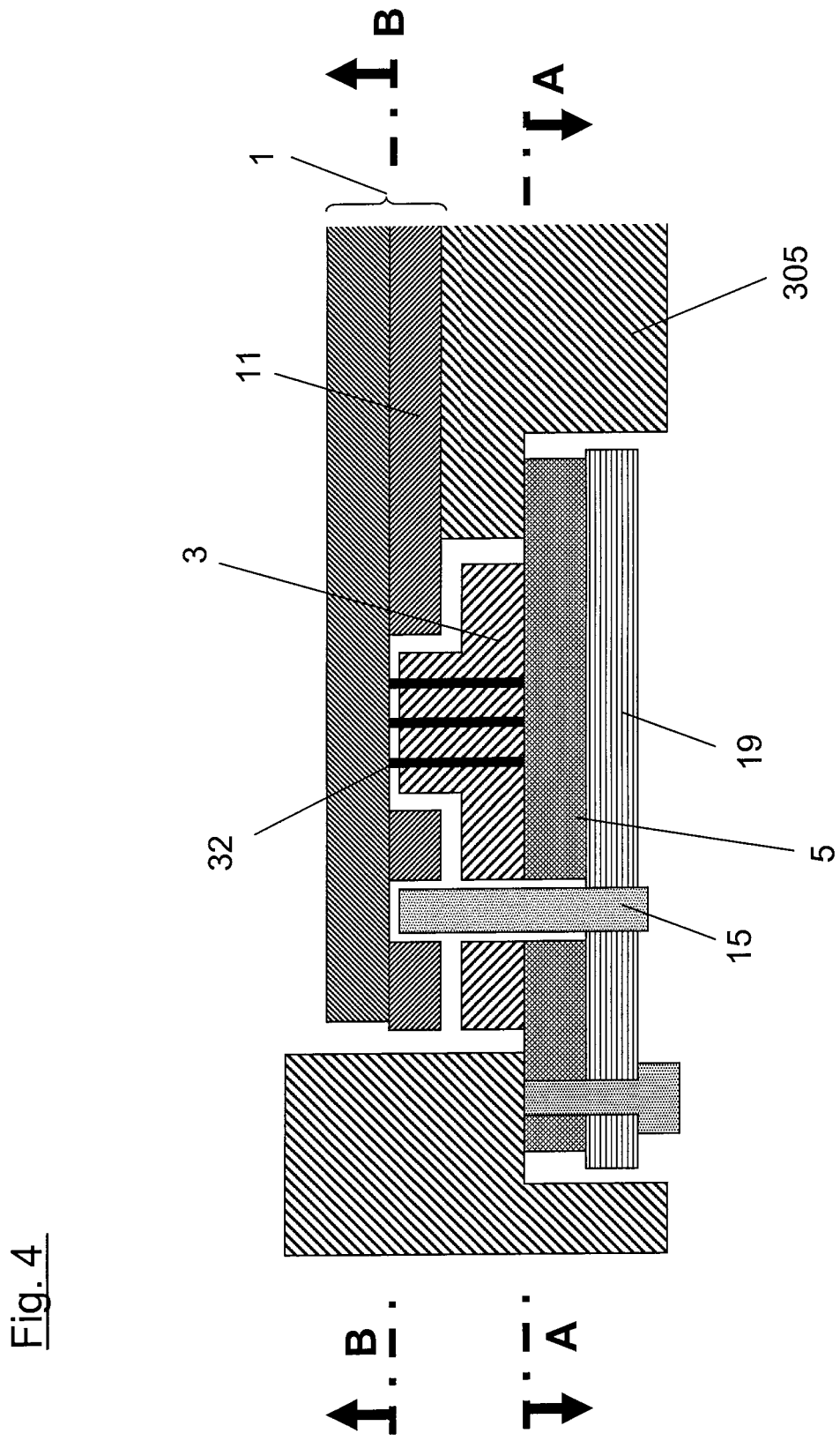
FIG. 4 shows a cross-sectional illustration of an apparatus according to the invention with a T/R module with which contact has been made (detail)

FIG. 4 shows a vertical section through one embodiment of the apparatus according to the invention with a T/R module 1 in which contact has already been made (the illustration shows only half of the apparatus, as a result of which the central temperature-control apparatus 305 is now located at the right-hand edge in FIG. 4). The figure is highly schematic and does not show all the details from FIGS. 1, 2 and 5. The T/R module 1 to be tested is located at the top, with its base plate 11 on the temperature-control unit 305. The vertically moving unit comprises the contact-making unit 3 with contact pins 32 integrated in it, the line substrate 5 and a mounting plate 19. The register pins 15 are anchored on the mounting plate. The line substrate 5 strikes a stop on the temperature-control apparatus 305. In this position, the contact pins 32 make the connection between the T/R module 1 and the line substrate 5. The contact pins 32 are advantageously designed such that they press in sprung manner against the connecting surfaces of the T/R module 1.

Figure 5:
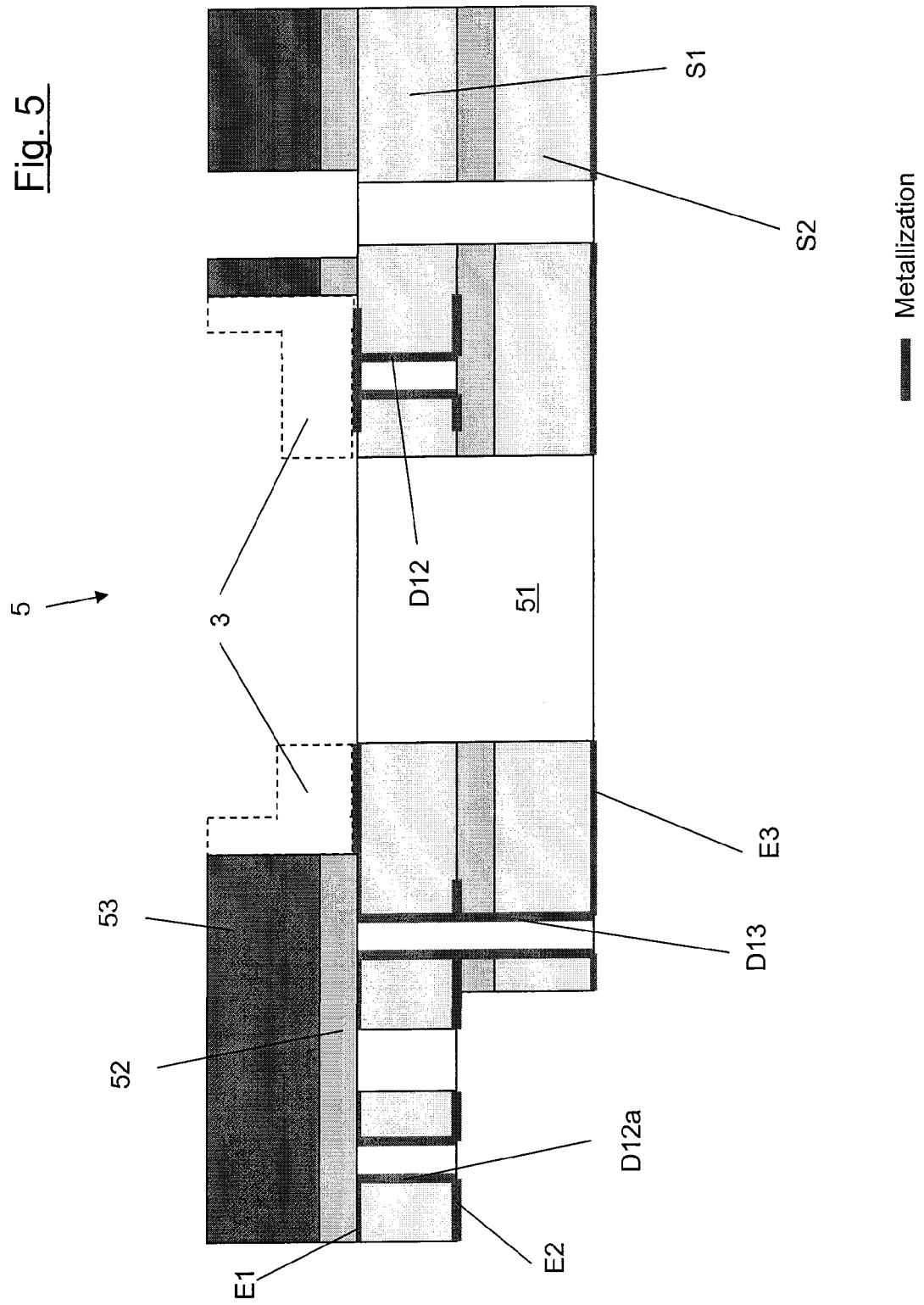
FIG. 5 shows a cross-sectional illustration of a line substrate.

FIG. 5 shows a cross-sectional illustration of the line substrate 5, which is in the form of a shielded triplate line. This comprises three parallel metallization planes E1, E2, E3, separated by two substrates S1, S2. The middle metallization plane contains the inner conductor, which is in the form of a strip, of the triplate line. Additional measures can be provided in order to shield and suppress higher modes or undesirable fields, and these will be explained further below. The triplate line therefore becomes a shielded triplate line.

Since the line substrate 5 is in the form of a rectangular frame, it surrounds an open inner area 51 (this can be achieved, for example by milling out a closed substrate). The line substrate 5 is adhesively bonded using an adhesive layer 52 to a mounting plate 53 composed of metal, for example aluminum. The position of the contact-making element 3, which is likewise in the form of a frame, is indicated by dashed line, and it is adjacent to the T/R module to be tested (not shown).

Metallized plated-through contacts D12, D12a, D13 are located within the line substrate 5, both from the upper metallization plane on the module side E1 to that remote from the module E3 and from the upper metallization plane on the module side E1 to the middle metallization plane E2. These are used either to guide the RF signal or to suppress any type of crosstalk by higher modes. Holes without metallization which are likewise shown in FIG. 5 are used for mechanical attachment of the parts to one another.

At one end, the line substrate 5 has a junction between the shielded triplate line and the shielded coplanar line. The lower metallization plane remote from the module E3 and the lower substrate S2 were removed as far as the middle metallization plane E2 for this purpose. The plug for connection of a coaxial line of the test device can be fitted in this area.

In order to suppress the excitation of higher modes in the junction area, which can propagate along the plug flange and then further between the line substrate 5 and the metallic mounting plate 53, an electrically conductive adhesive film is advantageously used as the adhesive layer 52.

Figure 6:
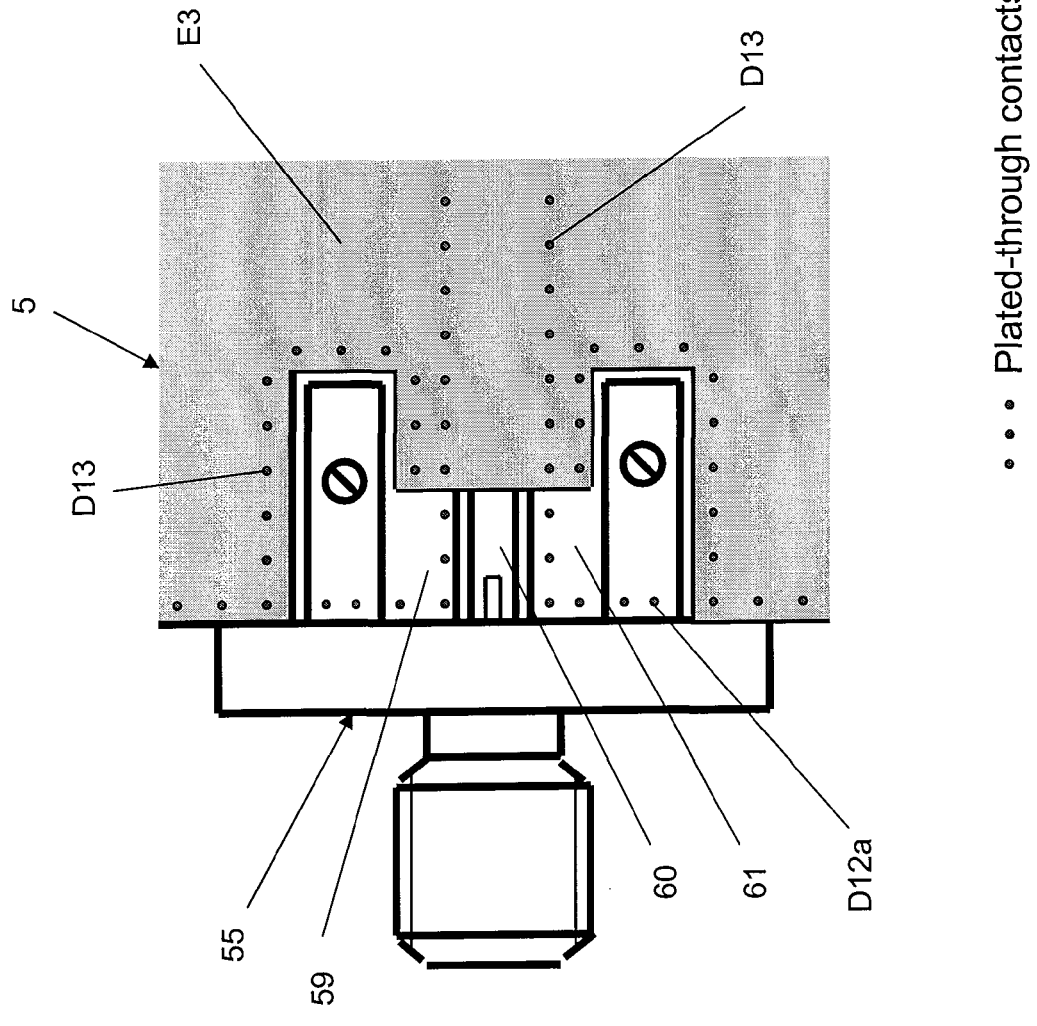
FIG. 6 shows the connection of a coaxial plug to the end of the line substrate.

FIG. 6 shows a view from underneath of this junction area of the line substrate 5, in which the coaxial plug 55 has already been connected. The lower metallization plane remote from the module E3 and the substrate S2 above it were removed, to the extent necessary to fit the plug 55. The inner conductor 60 of the triplate line is therefore exposed in this area on the middle metallization plane E2. The inner conductor 60 is connected to the inner conductor of the coaxial plug 55.

In order to suppress higher modes, plated-through contacts D13 are provided along the external contour of the coaxial plug, between the two outer metallization planes E1, E3 of the triplate line. Further plated-through contacts D12a are provided for the same purpose along the plug flange, between the lower metallization plane close to the module E1, and the middle metallization plane E2.

In order to shield the RF signal, further plated-through contacts D13 are provided between the metallization plane on the module side E1 and the metallization plane remote from the module E3, on both sides along the inner conductor 60 of the middle metallization plane E2. In the junction area, in which there is no upper metallization plane E1, these plated-through contacts parallel to the inner conductor connect the lower metallization plane close to the module E3 and the middle metallization plane E2. The plated-through contacts D13 on both sides of the inner conductor are connected to one another by a metallization surface 130 (see FIG. 9) which runs on both sides of the inner conductor 60, and parallel to it.

Figure 7:
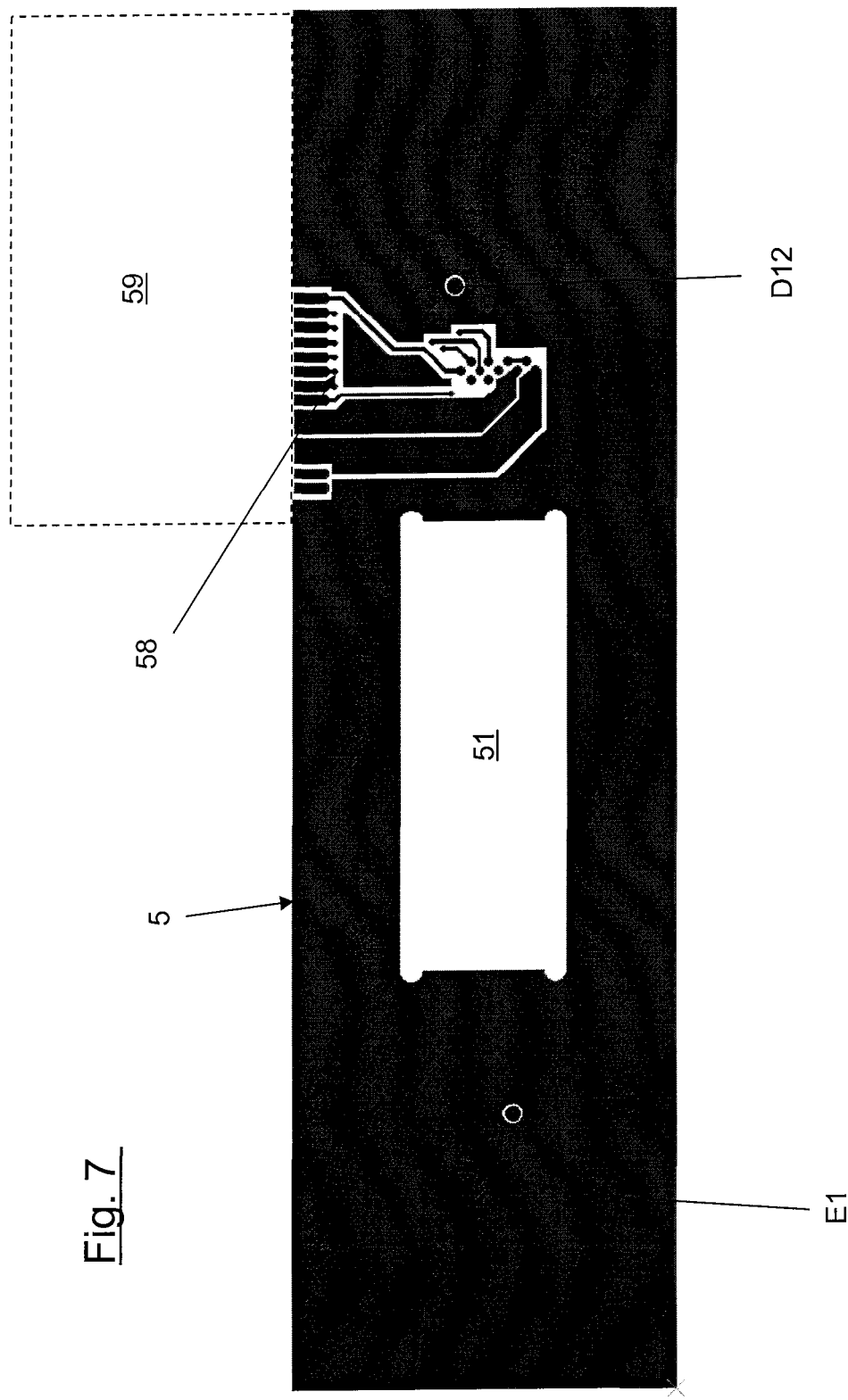
FIG. 7 shows a plan view of a line substrate.

FIG. 7 shows a plan view of the line substrate 5, that is to say seen in the direction from the T/R module. The figure shows the rectangular embodiment, in the form of a frame, of the metallization plane on the module side E1, with an inner opening 51 for the temperature-control unit.

The plated-through contact D12 is used to carry the RF signal from the T/R module to the middle metallization plane E2 in the triplate line. This will be explained in more detail further below in conjunction with FIG. 9.

The line structures 58, which are incorporated in the metallization plane E1, for the DC (power supply) and control signals can likewise be seen. These line structures comprise contact surfaces for making contact with the spring contact pins which are used in the contact-making unit. The DC signals and the control signals can be carried on this plane directly to a printed circuit board 59 (whose outline is shown by dashed lines in FIG. 7), which is arranged on the line substrate 5, and can be passed on from there using a multipole plug to the measurement instruments in the test device.

The integration of the power supply, which is fitted on the separate printed circuit board 59, in the line substrate offers a number of advantages. For example, short line connections can be achieved, as are required for interference-free operation of the T/R modules. This also applies to the RF connections. Short connecting paths are advantageously implemented in the design of the line substrate and in the further connecting structures, in order to suppress or prevent coupling and/or resonance effects.

FIG. 8 shows a view along the line B-B in FIG. 4. The figure shows the metallic contact surfaces 85a, 85b of the RF signal output of the T/R module 1 (the connection for the input signal is designed identically). The connection comprises a central contact surface 85a, which is surrounded by an annular contact surface 85b. An area 86 with non-metalized dielectric is located in between.

This geometry is transferred to the configuration of the contact-making unit. The contact points 31 of the spring contact pins 32 (FIG. 4) within the contact-making unit are likewise marked. The ground/signal/ground junction is produced by the central spring contact pin on the contact surface 85a. In order to suppress waves which propagate in the contact-making unit (which acts as a dielectric waveguide), additional spring contact pins are fitted within the contact-making unit in order to shield the RF signal, and their contact points 31 lie on the annular contact surface 85b. The distance between these outer contact pins is chosen so as to achieve the shielded effect. In the contact-making unit 3, the pins provide a guide for the RF signal, based on a coaxial line. The structure of the RF signal being guided in an approximate manner to a coaxial line continues within the line substrate, as can be seen from FIG. 9 and as will become evident from the description below.

FIG. 9 shows the connecting geometry for the RF signal on the upper face of the line substrate, that is to say on the metallization plane on the module side E1 of the triplate line (view along the line A-A in FIG. 4). The figure likewise shows the contact points 31 of the spring contact pins 32 of the contact-making unit 3.

The RF signal is introduced using the plated-through contact D12 (see FIG. 5) to the middle metallization plane E2 of the shielded triplate line, where it is passed on via the inner conductor of the triplate line. The plated-through contact D12 in the view in FIG. 9 is located behind the conductive contact surface 81, on which the contact point 31 of a spring contact pin 32 is located. The annular non-metalized area of the metallization plane E1 surrounding this contact surface is shown by shading.

The plated-through contact D12 for guiding the RF signal within the line substrate 5 is advantageously surrounded by further plated-through contacts D13 for electrical connection of the metallization planes on the module side and remote from the module. Plated-through contacts D13 such as these are also provided on both sides along the inner conductor 60 (illustrated by dashed lines in FIG. 9) of the middle metallization plane E2. In the middle metallization plane, the plated-through contacts D13 are connected to one another via the metallization surface 130 (shown by dashed lines). Corresponding to the position of the plated-through contacts D13, the metallization surface 130 surrounds the plated-through contact in a circular section, which continues in two straight-line sections on both sides and parallel to the inner conductor 60.

These additional measures are intended for shielding and for suppressing higher modes and undesirable propagation of fields. In the middle plane E2, the connecting line runs from the plated-through contact D12 to the coaxial plug 55 (FIG. 6), that is to say as a shielded triplate line.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. An apparatus for making contact between a transmit-receive (T/R) module and a test device for transmission of RF signals, the apparatus comprising:
   a mechanically guided contact-making unit in the form of a frame and having a plurality of contact elements for making contact with the T/R module;
   a line substrate arranged rigidly on a side of the contact-making unit facing away from the T/R module, wherein the line substrate is electrically connected to the T/R module, the line substrate is a triplate line, and the RF signals are passed to the test device via the line substrate;
   one or more register pins for defined alignment of the T/R module with respect to the contact-making unit;
   a fixing unit for mechanical fixing of the T/R module;
   a shifting device with a plurality of inclined planes each having an incline that rises from a direction of the contact-making unit to a direction away from the contact-making unit, wherein the shifting device is configured to move in the direction of the contact-making unit so that a horizontal movement of the plurality of inclined planes in the direction of the contact-making unit cause the contact-making unit to move vertically toward the T/R module, wherein, when the contact-making unit reaches a defined final position, the contact is made with the T/R module via the contact elements in one process.

2. The apparatus as claimed in claim 1, wherein a final position of the contact-making unit is defined by a stop.

3. The apparatus as claimed in claim 2, wherein the contact elements of the contact-making unit are spring contact pins that touch metallic contact surfaces on the line substrate and T/R module when the contact-making unit reaches the final position.

4. The apparatus as claimed in claim 3, wherein the contact surfaces on the line substrate or T/R module have a central area and an outer area surrounding it, wherein the central area and the outer area are separated by an area with non-metalized dielectric.

5. The apparatus as claimed in claim 4, wherein the contact element connecting the central area of the contact surfaces is surrounded by further contact elements connecting the outer area of the contact surfaces in order to shield the RF signal.

6. The apparatus as claimed in claim 1, wherein the RF signal passes from a metallization plane on the T/R module side to a middle metallization plane of the triplate line.

7. The apparatus as claimed in claim 1, wherein a plated-through contact for the RF signal is surrounded by plated-through contacts between the metallization plane on the T/R module side and the metallization plane remote from the T/R module of the triplate line.

8. The apparatus as claimed in claim 7, wherein further plated-through contacts are provided between the metallization plane on the T/R module side and the metallization plane remote from the T/R module, on both sides along an inner conductor of the middle metallization plane.

9. The apparatus as claimed in claim 8, wherein the plated-through contacts between the metallization plane on the T/R module side and the metallization plane remote from the T/R module are conductively connected to one another in the middle metallization plane using a metallization surface.

10. The apparatus as claimed in claim 1, wherein a junction to a coplanar line is provided at the end of the triplate line.

11. The apparatus as claimed in claim 10, wherein the coplanar line for connection of the test device is connected to a coaxial plug.

12. The apparatus as claimed in claim 11, wherein plated-through contacts are provided on the triplate line along an external contour of the coaxial plug, between a metallization plane on the T/R module side and a metallization plane remote from the module of the triplate line.

13. The apparatus as claimed in claim 1, wherein direct-current and control signals are transmittable via the line substrate and contact pins, which are provided within the contact-making unit, between the T/R module and a printed circuit board which is arranged on the line substrate, wherein the signal is carried within the metallization plane on the module side of the triplate line.

14. The apparatus as claimed in claim 1, wherein the shifting device is arranged below the contact-making unit.

15. The apparatus as claimed in claim 1, wherein the shifting device has a first side with a length running in a direction perpendicular to the horizontal movement direction, and a second and third sides joining the first side and having lengths running in the horizontal movement direction, wherein at least a first one of the plurality of inclined planes is arranged on the second side and at least a second one of the plurality of inclined planes is arranged on the third side.

16. The apparatus as claimed in claim 1, at least a third one of the plurality of inclined planes is arranged separated from and behind the first one of the plurality of inclined planes on the second side and a fourth one of the plurality of inclined planes is arranged separated from and behind the second one of the plurality of inclined planes on the third side.

\* \* \* \* \*